United States Patent
Gu et al.

(10) Patent No.: US 9,167,715 B2
(45) Date of Patent: Oct. 20, 2015

(54) DISPLAY DEVICE

(75) Inventors: Yubo Gu, Guangdong (CN); Liuyang Yang, Guangdong (CN); Pei Jia, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 175 days.

(21) Appl. No.: 13/701,026

(22) PCT Filed: Sep. 7, 2012

(86) PCT No.: PCT/CN2012/081115
§ 371 (c)(1),
(2), (4) Date: Nov. 30, 2012

(87) PCT Pub. No.: WO2014/032326
PCT Pub. Date: Mar. 6, 2014

(65) Prior Publication Data
US 2014/0055919 A1     Feb. 27, 2014

(51) Int. Cl.
*G06F 1/16* (2006.01)
*H05K 7/14* (2006.01)
*H05K 5/03* (2006.01)
*H05K 5/02* (2006.01)

(52) U.S. Cl.
CPC ............... *H05K 7/1418* (2013.01); *H05K 5/02* (2013.01); *H05K 5/03* (2013.01); *G06F 1/16* (2013.01)

(58) Field of Classification Search
CPC ............... H05K 5/03; G09F 9/30; G06F 1/16
USPC ............................................ 361/679.21, 809
See application file for complete search history.

(56) References Cited

U.S. PATENT DOCUMENTS

2003/0143766 A1* 7/2003 Ishikawa et al. ............... 438/22
2012/0099259 A1* 4/2012 Park ........................ 361/679.01

* cited by examiner

*Primary Examiner* — Dion R Ferguson
*Assistant Examiner* — Mandeep Buttar

(57) ABSTRACT

The present invention relates to a display device, which comprises a rear cover, a display panel, a drive device and an adhesive member, the adhesive member including a first surface and a second surface opposite to the first surface; the first surface is bonded to the upper end of the rear cover, and the second surface is bonded to the upper end of the display panel, which is bonded at the lower end to the lower end of the rear cover; the drive device is arranged in the rear cover and electrically connected to the display panel to drive the display panel.

4 Claims, 4 Drawing Sheets

DISPLAY DEVICE

FIELD OF THE INVENTION

The present invention relates to a display device, and more particularly to a flat panel display device.

BACKGROUND OF THE INVENTION

Flat panel display devices such as a liquid crystal display device and a plasma display device are favored by users because of such advantages as being light and thin. The flat panel display device in the related technology generally includes a front cover, a rear cover matched with the front cover, and a display panel clamped between the front and rear covers, the rear cover being generally provided in the middle with a rectangular window for exposing the side of the display panel where an image is displayed. However, due to the presence of the front cover, a rim is formed at the periphery of the display panel, making the size of the display device further reduced such as to be subject to restrictions in the case of a certain display size.

SUMMARY OF THE INVENTION

The problem to be solved by the present invention is that, to provide an improved display device aiming at the above shortages in the related technology.

To achieve the above object, A display device is provided, comprising a rear cover, a display panel, a drive device and an adhesive member, the adhesive member including a first surface and a second surface opposite to the first surface; the first surface is bonded to an upper end of the rear cover, and the second surface is bonded to an upper end of the display panel, which is bonded at its lower end to a lower end of the rear cover; the drive device is arranged in the rear cover and electrically connected to the display panel to drive the display panel.

Preferably, the rear cover includes a bottom wall, an upper end sidewall arranged at an upper side of the bottom wall, and an upper end coupling portion extending downward from the upper end sidewall, the adhesive member being bonded at the first surface to the upper end coupling portion.

Preferably, the rear cover includes an upper end support portion for supporting the upper end coupling portion.

Preferably, the upper end support portion is connected between the upper end coupling portion and the bottom wall.

Preferably, the display device includes an upper end guide frame for guiding the drive device, the upper end guide frame including an upper end panel support portion and an upper end guide sidewall perpendicularly intersecting the upper end panel support portion, the upper end panel support portion being coupled to the display panel; the upper end guide sidewall is coupled to the upper end support portion of the rear cover, and surrounds an upper end side of the drive device.

Preferably, the upper end panel support portion is bonded to the first surface of the adhesive member.

Preferably, the display device includes a lower end guide frame for guiding the drive device and another adhesive member, the lower end guide frame being coupled to the lower end of the rear cover, the another adhesive member bonding the lower end of the display panel to the lower end guide frame.

Preferably, the display device includes a lower veneer structure, which is coupled to the lower end guide frame and covers and supports the lower end of the display panel.

Preferably, the lower end of the rear cover includes a lower end coupling portion and a lower end support portion for supporting the lower end coupling portion; the lower end guide frame includes a guide sidewall, a panel support portion perpendicular to the guide sidewall, a guide coupling portion, and a lower veneer structure support portion; the guide sidewall surrounds a lower end side of the drive device, the panel support portion is bonded to the lower end of the display panel through the another adhesive member, the guide coupling portion is coupled to the lower end coupling portion of the rear cover, and the lower veneer structure support portion is coupled to the lower veneer structure.

Preferably, the upper end sidewall of the rear cover extends away from the bottom wall to form a protection portion for guiding and protecting the upper side of the display panel.

The present invention has the following beneficial effects: Compared with the related technology, the display panel of the display device of the present invention is exposed at the front surface of the display device and bonded to the rear cover through the adhesive member, such that the front cover is not needed, thus reducing the manufacturing cost, decreasing weight and making the device further lighter and thinner.

BRIEF DESCRIPTION OF THE DRAWINGS

The present invention will further be described below with reference to drawings and embodiments.

DETAILED DESCRIPTION OF THE PREFERRED EMBODIMENT

The present invention will further be described below in detail with reference to specific embodiments and appended drawings of the description.

Figure 1:
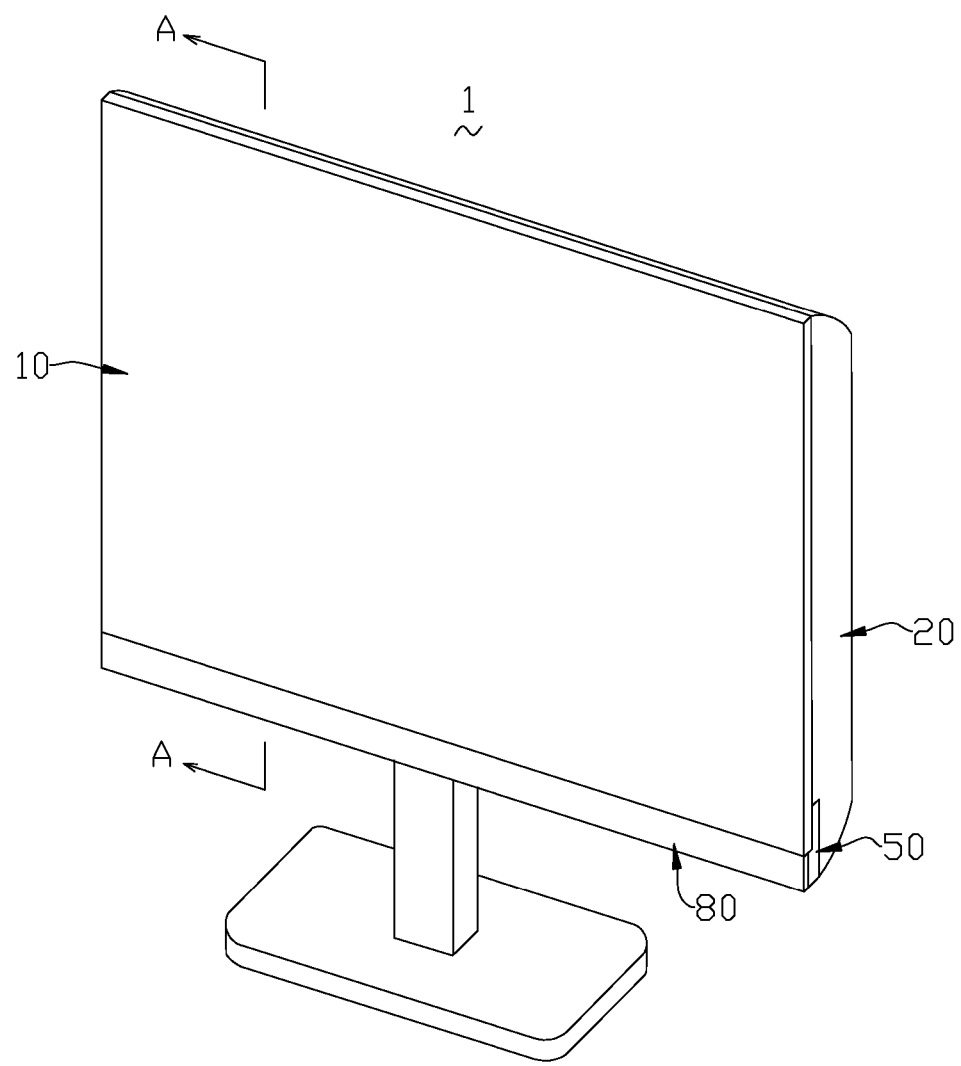
FIG. 1 is a three-dimensional schematic view of the display device according some embodiments of the present invention.
Figure 2:
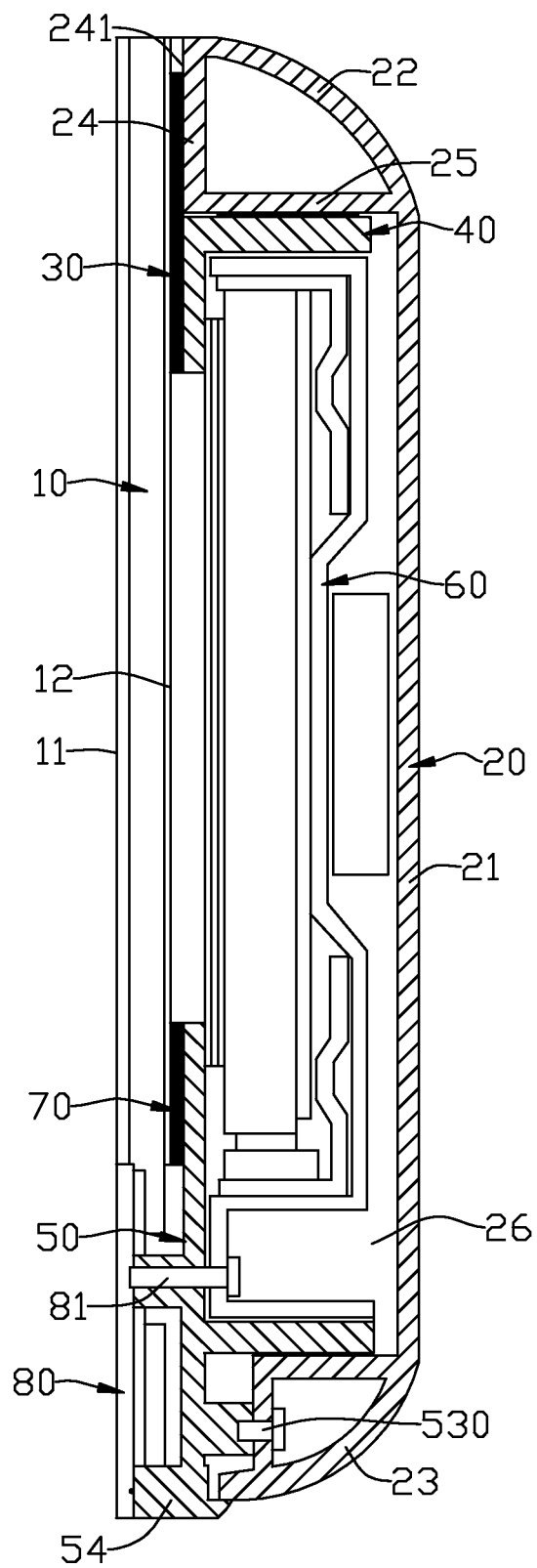
FIG. 2 is a sectional schematic view of the display device along the line A-A in FIG. 1.
Figure 3:
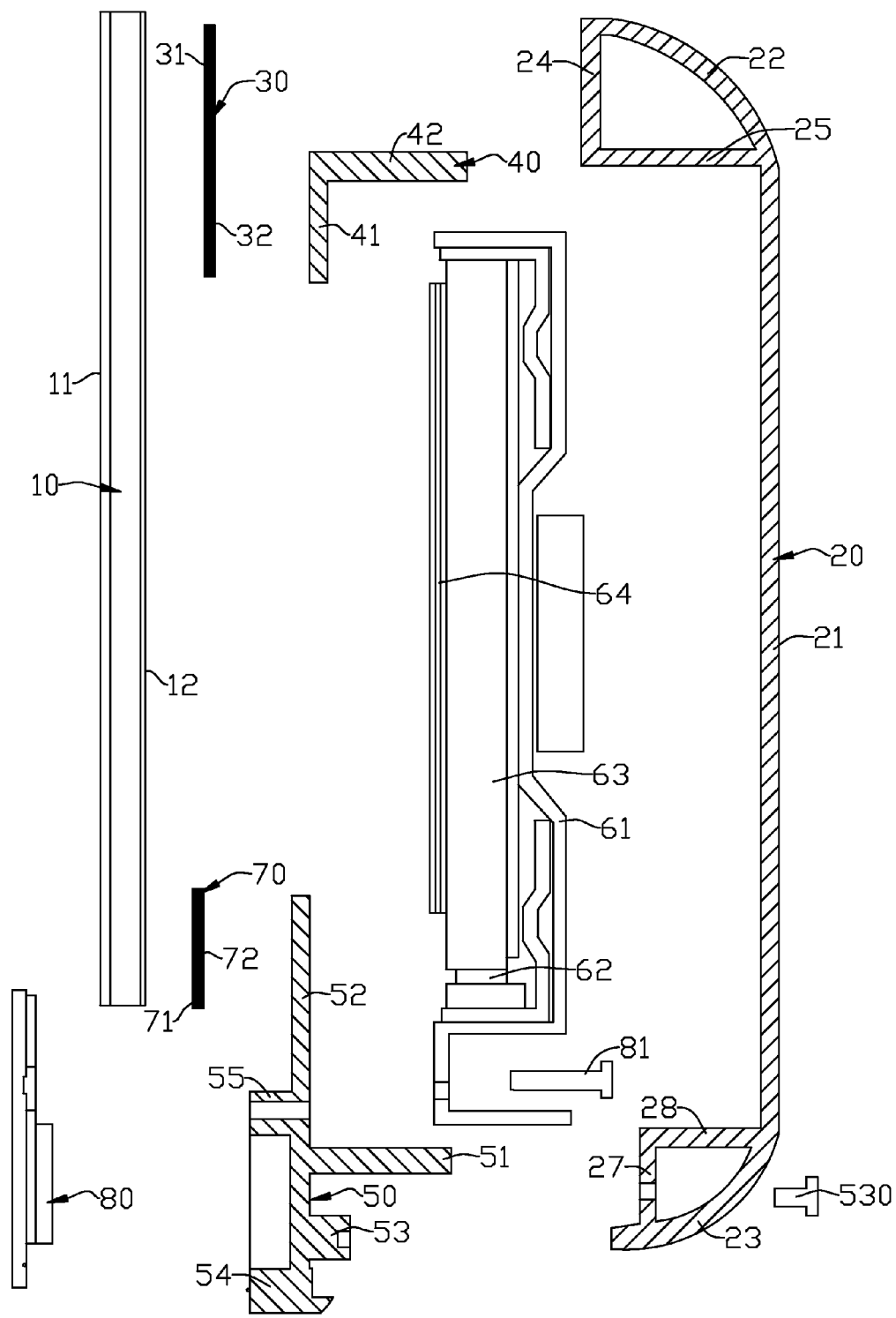
FIG. 3 is an exploded view of the display device as shown in FIG. 1.

FIG. 1 is a three-dimensional schematic view of the display device 1 according some embodiments of the present invention. FIG. 2 is a sectional schematic view of the display device 1 along the line A-A in FIG. 1. FIG. 3 is an exploded schematic view of the display device 1 as shown in FIG. 2. The display panel 10 of the display device 1 is exposed at the front surface of the display device 1 and bonded to the rear cover 20 through the adhesive member, such that the front cover is not needed, thus reducing the manufacturing cost, decreasing weight and making the device further lighter and thinner.

As shown in FIGS. 1-3, the display device 1 in some embodiments may include a display panel 10, a rear cover 20, a first adhesive member 30, an upper end guide frame 40, a lower end guide frame 50, a drive device 60, a second adhesive member 70, and a lower veneer structure 80. The first adhesive member 30 is bonded to the upper end of the rear cover 20, the lower end guide frame 50 is coupled to the lower end of the rear cover 20, the second adhesive member 70 is bonded to the lower end guide frame 50, the upper and lower ends of the display panel 10 are bonded to the first adhesive member 30 and the second adhesive member 70, respectively, and the lower veneer structure 80 is coupled to the lower end guide frame 50 and covers and supports the lower end of the display panel 10. The drive device 60 is arranged in the rear cover 20, and electrically connected to the display panel 10 to drive the display panel 10.

Again as shown in FIGS. 2 and 3, the display panel 10 in some embodiments may include a front side 11 for displaying an image and a rear side 12 opposite to the front side 11. The display panel 10 may be such flat panel display panels as a liquid crystal panel or a plasma panel; when the display panel 10 is the liquid crystal panel, it is only the part in the liquid crystal display device that actually displays an image and does not include a backlight module; when the display panel 10 is the plasma panel, it is only the part in the plasma display device that actually displays an image and does not include various drive circuit boards. That is, the display panel 10 does not include various drive circuit boards or backlight modules that are applied to various flat panel display devices, and is actually only the part for displaying an image.

The rear cover 20 in some embodiments may be made of such materials as plastics and metals, and includes a bottom wall 21, an upper end sidewall 22 and a lower end sidewall 23. The bottom wall 21 may be a rectangular plate in some embodiments; both the upper end sidewall 22 and the lower end sidewall 23 may be arc-shaped plates in some embodiments, and are coupled to the upper and lower sides of the bottom wall 21, respectively, to define a receiving space 26.

The upper end of the rear cover 20 may also include an upper end coupling portion 24 and an upper end support portion 25 in some embodiments. The upper end coupling portion 24 extends out from the inner side of the top edge of the upper end sidewall 22, so as to be coupled to the upper end of the display panel 10, the upper end coupling portion 24 including a binding surface 241 opposite to the rear side of the display panel 10. The upper end support portion 25 extends horizontally to the bottom wall 21 from the end of the upper end coupling portion 24, so as to support the upper end coupling portion 24.

The lower end of the rear cover 20 may also include a lower end coupling portion 27 and a lower end support portion 28 in some embodiments. The lower end coupling portion 27, for being coupled to the lower end guide frame 50, extends upward from the inner wall of the lower end sidewall 23. The lower end support portion 28 extends horizontally to the bottom wall 21 from the end of the lower end coupling portion 27, so as to support the lower end coupling portion 27.

The first adhesive member 30 may include a surface 31 and a surface 32 opposite to the surface 31 in some embodiments, the surface 31 being bonded to the rear side 12 of the display panel 10; the surface 32 is bonded to the binding surface 241 of the upper end coupling portion 24 of the rear cover 20, thus coupling the upper end of the display panel 10 to the upper end of the rear cover 20. The first adhesive member 30 may be Velcro tape or double-sided tape in some embodiments.

The upper end guide frame 40 may be in an L shape in some embodiments, and includes an upper end panel support portion 41 and an upper end guide sidewall 42 perpendicular to the upper end panel support portion 41. The upper end panel support portion 41 is bonded to the surface 32 of the first adhesive member 30, and thus bonded to the display panel 10. The upper end guide sidewall 42 is bonded or coupled in other ways to the upper end support portion 25 of the rear cover 20, and surrounds the upper end side of the drive device 60.

The lower end guide frame 50 may include in some embodiments an upper end guide sidewall 51, a panel support portion 52, a guide coupling portion 53, and lower veneer structure support portions 54 and 55. The guide sidewall 51 is guided by the lower end support portion 28 of the rear cover 20, so as to surround the lower end side of the drive device 60. The panel support portion 52 extends perpendicularly from the end of the guide sidewall 51 close to the display panel 10. The guide coupling portion 53 is connected with the lower end coupling portion 27 of the rear cover 20 through a screw 530, thus coupling the lower end guide frame 50 to the lower end of the rear cover 20.

In some embodiments, the display panel 10 is the liquid crystal panel, and correspondingly the drive device 60 is the backlight module. The drive device 60 is installed at the rear side of the display panel 10, providing backlight for the display panel 10, thus making the display panel 10 display images. The drive device 60 may include a bottom cover 61, a light source 62, a light guide plate 63, and an optical sheet 64 in some embodiments. The light source 62 may be provided with a fluorescent lamp or a light emitting diode, and the light guide plate 63 is in a flat plate shape so as to transmit the light from the light source 62 to the display panel 10. The optical sheet 64 is arranged on the light guide plate 63, so as to improve the luminance characteristics of the light transmitted from the light guide plate 63 to the display panel 10. It may be comprehended that when the display panel 10 is the plasma panel, the drive device 60 may include various printed circuit board assemblies for driving the plasma panel.

The second adhesive member 70 may include a surface 71 and a surface 72 opposite to the surface 71 in some embodiments, the surface 71 being bonded to the rear side 12 of the display panel 10; the surface 72 is bonded to the panel support portion 52 of the lower end guide frame 50, thus bonding the lower end of the display panel 10 to the lower end guide frame 50.

The lower veneer structure 80 may be fixed to the lower veneer structure support portions 54 and 55 of the lower end guide frame 50 through such connectors as a screw 81, and covers and supports the lower end of the display panel 10 exposed outside.

Figure 4:
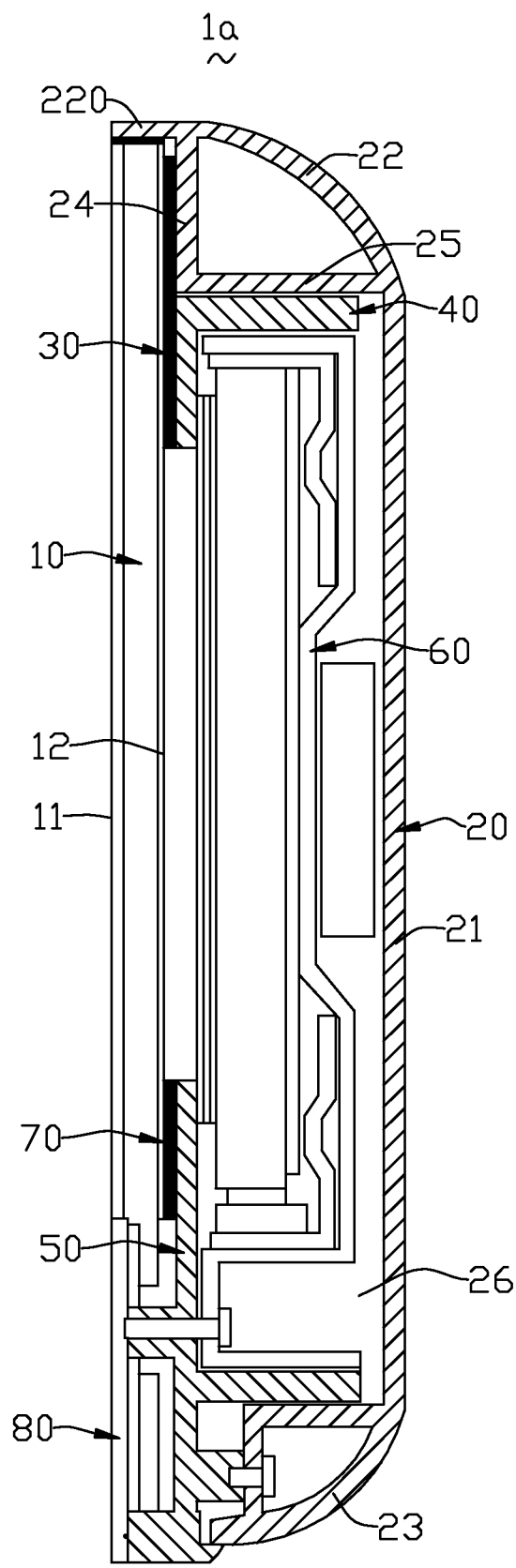
FIG. 4 is a sectional schematic view of the display device according the other embodiment of the present invention.

The display device 1a in the other embodiment of the present invention as shown in FIG. 4 has a similar structure to the display device 1. They are different from each other mainly in that the upper end sidewall 22 of the display device 1a further extends away from the bottom wall 22 to form a protection portion 220, which is perpendicular to the upper end coupling portion 24 for guiding and protecting the upper side of the display panel 10. In some embodiments, the protection portion 220 may be bonded to the upper side of the display panel 10 through the adhesive member.

What were described above are only the preferred embodiments of the present invention. The protection scope of the present invention is not limited to the above embodiments, and all the technical solutions achieved from the idea of the present invention shall fall within the protection scope of the present invention. For those of ordinary skill in the art, it should be indicated that improvements and modifications made under the premise of not departing from the principles of the present invention shall also be regarded as being within the protection scope of the invention.

What is claimed is:

1. A display device, comprising
a rear cover,
a display panel,
a drive device,
a first adhesive member, including a first surface and a second surface opposite to the first surface,
an upper end guide frame for guiding the drive device, and
a second adhesive member including a third surface and a fourth surface opposite to the third surface;
wherein, the drive device is arranged in the rear cover and electrically connected to the display panel to drive the display panel;
the rear cover configured to be integrally formed, includes a bottom wall, an upper end sidewall arranged at an upper side of the bottom wall, an upper end coupling portion formed by extending an end of the upper end sidewall downwardly, an upper end support portion configured to support the upper end coupling portion and connected between the upper end coupling portion and the bottom wall, and a protection portion formed by extending the end of the upper end sidewall horizontally in a direction deviating from the bottom wall and configured to guide and protect an upper side of the display panel;

the upper end guide frame is in an L shape, and includes an upper end panel support portion and an upper end guide sidewall perpendicularly intersecting the upper end panel support portion;

the upper end coupling portion and the upper end panel support portion are configured to be coplanar, separated from each other and bonded to the first surface, the second surface is bonded to an upper end of the display panel, and a lower end of the display panel is bonded to a lower end of the rear cover;

the upper end guide sidewall is bonded to the third surface of the second adhesive member and the fourth surface of the second adhesive member is bonded to the upper end support portion, thus the upper end guide frame is detachably connected to the rear cover;

the upper end guide sidewall surrounds an upper end side of the drive device; and the protection portion is perpendicular to the upper end coupling portion.

2. The display device of claim 1, wherein, the display device includes a lower end guide frame for guiding the drive device and another adhesive member, the lower end guide frame being coupled to the lower end of the rear cover, the another adhesive member bonding a lower end of the display panel to the lower end guide frame.

3. The display device of claim 2, wherein, the display device includes a lower veneer structure, which is coupled to the lower end guide frame and covers and supports the lower end of the display panel.

4. The display device of claim 3, wherein, the lower end of the rear cover includes a lower end coupling portion and a lower end support portion for supporting the lower end coupling portion; the lower end guide frame includes a guide sidewall, a panel support portion perpendicular to the guide sidewall, a guide coupling portion, and a lower veneer structure support portion; the guide sidewall surrounds a lower end side of the drive device, the panel support portion is bonded to the lower end of the display panel through the another adhesive member, the guide coupling portion is coupled to the lower end coupling portion of the rear cover, and the lower veneer structure support portion is coupled to the lower veneer structure.

* * * * *